US012155387B2

United States Patent
Li et al.

(10) Patent No.: US 12,155,387 B2
(45) Date of Patent: Nov. 26, 2024

(54) LOW POWER OSCILLATOR CIRCUIT WITH TEMPERATURE COMPENSATION CIRCUIT AND ELECTRONIC APPARATUS THEREOF

(71) Applicant: NUVOTON TECHNOLOGY CORPORATION, Hsinchu (TW)

(72) Inventors: Cheng-Tao Li, Hsinchu (TW); Ping-Wen Lai, Hsinchu (TW)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 71 days.

(21) Appl. No.: 18/298,598

(22) Filed: Apr. 11, 2023

(65) Prior Publication Data

US 2024/0048130 A1   Feb. 8, 2024

(30) Foreign Application Priority Data

Aug. 5, 2022   (TW) .................................. 111129523

(51) Int. Cl.
*H03K 3/03*  (2006.01)
*H03K 3/011*  (2006.01)
*H03K 5/135*  (2006.01)

(52) U.S. Cl.
CPC ........... *H03K 3/0307* (2013.01); *H03K 3/011* (2013.01); *H03K 5/135* (2013.01)

(58) Field of Classification Search
CPC ..................................................... H03K 3/0307
USPC ....................................................... 331/108 R
See application file for complete search history.

(56) References Cited

U.S. PATENT DOCUMENTS 6,657,506 B1 * 12/2003 Maheshwari .......... H03B 5/364
                                                                    331/109
2023/0344384 A1* 10/2023 Li ............................ H03B 5/24

* cited by examiner

*Primary Examiner* — Joseph Chang
(74) *Attorney, Agent, or Firm* — MUNCY, GEISSLER, OLDS & LOWE, P.C.

(57) ABSTRACT

A low power oscillator circuit with temperature compensation is illustrated. A current supply unit of an oscillator used to output an output current which is proportional to a reference current. As the temperature is increased, both a first threshold and the reference current of a unidirectional conduct in the temperature compensation circuit are decreased. Because a delay time of the oscillating signal is proportional to the first threshold voltage, and the delay time is inversely proportional to the reference current, the effects of the first threshold voltage and the reference current on the delay time are canceled, and the delay time of the oscillating signal is not affected by the temperature.

17 Claims, 2 Drawing Sheets

US 12,155,387 B2

LOW POWER OSCILLATOR CIRCUIT WITH TEMPERATURE COMPENSATION CIRCUIT AND ELECTRONIC APPARATUS THEREOF

CROSS-REFERENCE TO RELATED APPLICATION

This application claims the priority benefit of Taiwan application serial no. 111129523, filed on Aug. 5, 2022. The full disclosure of which is incorporated herein by reference.

BACKGROUND

Technical Field

The present disclosure is related to a low power oscillator circuit with a temperature compensation circuit. Particularly, the present disclosure is related to a low power oscillator circuit with a temperature compensation circuit and electronic apparatus thereof, in order to eliminate the effect of temperature on the delay time of the oscillating signal, and decrease the system voltage efficiently, so as to achieve the technical effect of the low frequency drift and the low power.

Description of Related Art

Refer to FIG. 1, FIG. 1 is a circuit diagram of an oscillator in the prior art. The oscillator 1 in the prior art includes a current mirror circuit 10, a bias circuit 11, a temperature compensation circuit 12, a charge storage circuit 13 and a voltage matching circuit 14.

The current mirror circuit 10 in FIG. 1, a first reference current Iref1 is outputted by a first reference current output end, a second reference current Iref2 is outputted by a second reference current output end, a third reference current Iref3 is outputted by a third reference current output end, and an oscillating voltage is outputted by an oscillating voltage output end, wherein the first reference current Iref1, the second reference current Iref2 and the third reference current Iref3 are decreased as the temperature is increased.

The bias circuit 11 is electrically connected to a bias end, and the bias circuit 11 is used to generate the reference current Vref to the current mirror circuit 10, and the reference current Vref is configured to be the bias voltage of the current mirror circuit 10.

The temperature compensation circuit 12 is electrically connected to the first reference current output end, and the temperature compensation circuit 12 is used to provide a first voltage V1 to the current mirror circuit 10, so that a temperature compensation voltage is generated by the current mirror circuit 10. The temperature compensation voltage described above is used to control whether the third reference current Iref3 in the current mirror circuit 10 is output to the third reference current output end, and the temperature compensation voltage is decreased as the temperature is increased.

The charge storage circuit 13 is electrically connected to the second reference current output end, and the charge storage circuit 13 is charged by receiving the second reference current Iref2. The voltage matching circuit 14 is electrically connected to the third reference current output end, and the voltage matching circuit 14 is used to provide a second voltage V2 to the current mirror circuit 10, wherein the second voltage V2, the first voltage V1 and the reference voltage Vref are the same.

According to the oscillator 1 in the prior art shown in FIG. 1, the reference current Iref is changed as the temperature changes, so as to affect a frequency (or cycle) of the oscillating signal generated by the oscillator 1. In order to decrease the frequency drift, it is necessary to add a compensation circuit to the oscillator for control compensation, so as to stabilize the frequency of the oscillating signal. However, the low power is required for the current applications. The additional compensation circuit in the oscillator will cause additional consumption of the power. Besides, the number of MOS transistors in a pathway from a system voltage VDD to a ground voltage GND in the oscillator 1 is three, so that the system voltage VDD may not be high enough to drive the oscillator 1. On the other hand, if the system voltage VDD is pulled-up, it may not be satisfied the requirements of low power and low supply voltage. Thus, for the design of the oscillator 1, the low power, low supply voltage and the precision of the frequency drift are trade-off condition factors, and there is still room for improvement.

SUMMARY

A low power oscillator circuit with a temperature compensation circuit is provided in the embodiments of the present disclosure, wherein the circuit includes a current supply unit, a temperature compensation circuit, a bias circuit, and a drive circuit.

The current supply unit includes a reference current output end, a first current output end, a second current output end, a third current output end, and a fourth current output end, wherein a reference current is output by the reference current output end, a first output current is outputted via the first current output end, a second output current is outputted via the second current output end, a third output current is outputted via the third current output end, a fourth output current is outputted via the fourth current output end. When the temperature increases, the reference current is decreased, and the first output current, the second output current, the third output current, and the fourth output current are proportional to the reference current.

The temperature compensation circuit is electrically connected to the second current output end, and including a unidirectional conduction element and a resistor string which is connected to the unidirectional conduction element in parallel. The unidirectional conduction element has a first threshold voltage, which is configured to determine whether the unidirectional conduction element is conducted. One end of the unidirectional conduction element that is connected to the resistor string is connected to the second current output end, and the other end of the unidirectional conduction element that is connected to the resistor string is at a low voltage.

The bias circuit is electrically connected to the reference current output end, the first current output end and the temperature compensation circuit, and configured to receive the reference current to generate a reference voltage and output the first output current to a middle node of the resistor string, to make a voltage of the middle node of the resistor string the same as the reference voltage, wherein the voltage of the middle node is configured to determine the first threshold voltage.

The drive voltage is electrically connected to the third current output end and the fourth current output end, includes an output transistor and a capacitor. One end of the capacitor is electrically connected to a gate of the output transistor, the other end of the capacitor is electrically connected to a source of the output transistor, and the source of the output transistor is electrically connected to the low voltage. The output transistor has a second threshold voltage, the second threshold voltage is configured to determine to turn on/off the output transistor, the output transistor generates an oscillating signal via turning on/off, and the first threshold voltage is equal to the second threshold voltage.

According some embodiments of the present disclosure, the current supply unit includes a plurality of PMOS transistors, a width length ratio of one of the plurality of the PMOS transistors outputting the third output current is K times a width length ratio of another of the plurality of PMOS transistors, and K is more than 0.

According some embodiments of the present disclosure, the bias circuit includes two NMOS transistors, each one of the two NMOS transistors has a gate-to-source voltage difference, and the gate-to-source voltage differences of the two NMOS transistors are the same.

According some embodiments of the present disclosure, when the temperature increases, the first threshold voltage and the reference voltage are decreased. Due to a delay time of the oscillating signal is proportional to the first threshold voltage, and the delay time is inversely proportional to the reference current, the effect of the first threshold voltage on the delay time counterbalances the effect of the reference current on the delay time, so that the delay time of the oscillating signal is not effected by the temperature.

According some embodiments of the present disclosure, the present disclosure further includes a clock buffer, which is electrically connected to the drive circuit, and the clock buffer is configured to buffer the oscillating signal and outputting the oscillating signal as a clock signal, wherein the oscillating signal is buffered.

According some embodiments of the present disclosure, the current supply unit includes a first PMOS transistor, a second PMOS transistor, a third PMOS transistor, a fourth PMOS transistor and a fifth PMOS transistor. The sources of the first PMOS transistor, the second PMOS transistor, the third PMOS transistor, the fourth PMOS transistor and the fifth PMOS transistor are electrically connected to a system voltage. A gate of the first PMOS transistor is electrically connected to a drain of the first PMOS transistor and gates of the second PMOS transistor, the third PMOS transistor, the fourth PMOS transistor and the fifth PMOS transistor. A drain of the first PMOS transistor is used as the reference current output end, a drain of the second PMOS transistor is used as the first current output end, a drain of the third PMOS transistor is used as the second current output end, a drain of the fourth PMOS transistor is used as the third current output end, and a drain of the fifth PMOS transistor is used as the fourth current output end.

According some embodiments of the present disclosure, the unidirectional conduction element of the temperature compensation circuit is a first NMOS transistor, and the resistor string includes a first temperature compensation resistor and a second temperature compensation resistor. The first temperature compensation resistor and the second temperature compensation resistor are connected in series, one end of the first temperature compensation resistor is electrically connected to the drain of the first NMOS transistor, the drain of the first NMOS transistor is electrically connected to the gate of the NMOS transistor and one end of the second temperature compensation resistor is electrically connected to the low voltage.

According some embodiments of the present disclosure, the bias circuit includes a second NMOS transistor, a third NMOS transistor and a bias resistor. The gate of the second NMOS transistor is electrically connected to the gate and the drain of the third NMOS transistor, and a first end of the bias resistor is electrically connected to the source of the second NMOS transistor, and a second end of the bias resistor is electrically connected to the low voltage.

An electronic device is further provided in some embodiments of the present disclosure, which includes a function circuit and any combination of the low power oscillator circuit described above. The function circuit is configured to operate based on an oscillating signal.

In summary, the oscillator provided in the embodiments of the present disclosure, not only providing the same effect on the temperature compensation as the prior art, but also providing the advantage to be driven by using lower supply voltage. Besides, the number of the transistors in the pathway between the system voltage and the low voltage is at most two.

In order to further understand the technology, means, and effects of the present disclosure, reference may be made by the detailed description and drawing as follows. Accordingly, the purposes, features and concepts of the present disclosure can be thoroughly and concretely understood. However, the following detailed description and drawings are only used to reference and illustrate the implementation of the present disclosure, and they are not used to limit the present disclosure.

BRIEF DESCRIPTION OF THE DRAWINGS

The accompanying drawings are provided to enable person having ordinary skill in the art can further understand the present disclosure, and the accompanying drawings are incorporated in and constitute a part of the specification of the present disclosure. The drawings illustrate exemplary embodiments of the present disclosure, and the description in the specification of the present disclosure is served to explain together the principal of the present disclosure.

DETAILED DESCRIPTION

Figure 1:
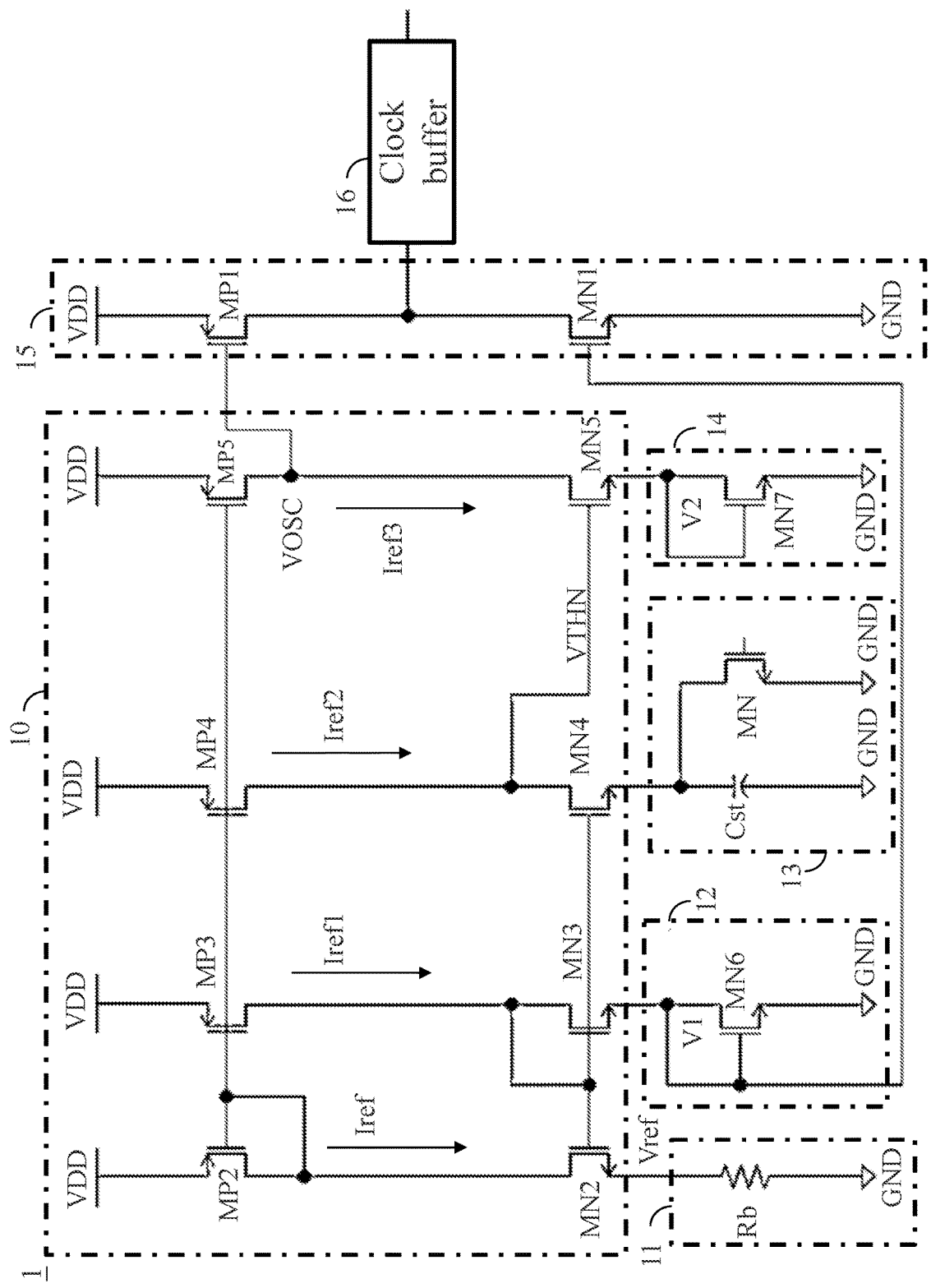
FIG. 1 is a circuit diagram of an oscillator in the prior art.

Reference will now be made in detail to exemplary embodiments of the present disclosure, exemplary embodiments of which are illustrated in the accompanying drawings. Wherever possible, the same element number is used in the drawings and the description to refer to the same or the similar part. Furthermore, exemplary embodiments are only one of implemental ways in the concept of design of the present disclosure, none of exemplars described below is intended to limit the present disclosure.

In order to solve the technical issues in the prior art, a low power oscillator circuit with a temperature compensation circuit and electronic apparatus thereof are provided in the embodiments of the present disclosure. Due to the temperature compensation effect, a frequency or period of an oscillating signal generated by the oscillator in the embodiments of the present disclosure has low frequency drift, that is, the frequency does not change with the temperature. It is not necessary to add a compensation circuit in the oscillator circuit, so as to execute the frequency drift compensation to the oscillating signal generated by the oscillator circuit. Moreover, compared with a circuit diagram of an oscillator in the prior art shown in FIG. 1, the major advantage of an oscillator in the present disclosure is the omission of the NMOS transistor MN6 and the NMOS transistor MN7. Besides, the system voltage that the oscillator requires in the present disclosure becomes lower, for example, the power supply of the whole oscillator circuit is decreased. Thus, the oscillator circuit in the embodiments of the present disclosure provides not only the low frequency drift effect as the prior art, but also the lower driving voltage in the system (i.e. the low power consumption effect of the whole circuit).

Figure 2:
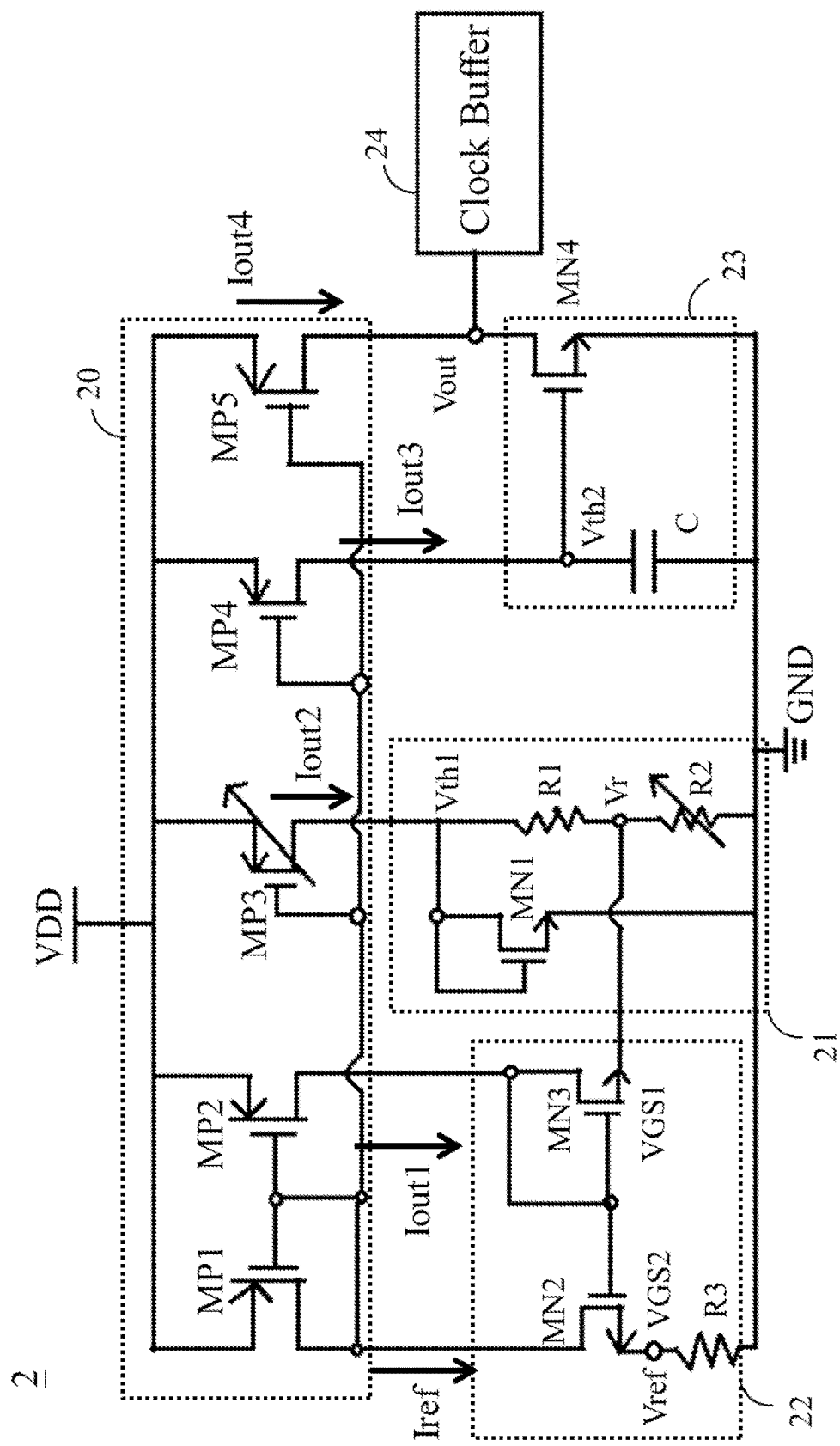
FIG. 2 is a circuit diagram of an oscillator according to an embodiment of the present disclosure.

Refer to FIG. 2, FIG. 2 is a circuit diagram of an oscillator according to an embodiment of the present disclosure. An oscillator 2 with temperature compensation includes a current supply unit 20, a temperature compensation circuit 21, a bias circuit 22, a drive circuit 23 and a clock buffer 24. The current supply unit 20 is electrically connected to the temperature compensation circuit 21, the bias circuit 22 and the drive circuit 23. By the gate of an output transistor turning on/off, the drive circuit 23 generates an oscillating signal to the clock buffer 24, so that the oscillating signal is cached by the clock buffer 24, and the buffered oscillating signal is used as a clock signal. It is noticed that the clock buffer 24 is not an essential element for an oscillator circuit in some applications.

The current supply unit 20 includes a reference current output end, a first current output end, a second current output end, a third current output end, and a fourth current output end. Then, a reference current Iref is outputted by the reference current output end, a first output current Iout1 is outputted by the first current output end, a second output current Iout2 is outputted by the second current output end, a third output current Iout3 is outputted by the third current output end, and a fourth output Iout4 current is outputted by the fourth current output end. Moreover, the reference current Iref is decreased as the temperature increases. The first output current Iout1, the second output current Iout2, the third output current Iout3, and the fourth output current Iout4 are proportional to the reference current Iref because of the circuit characteristics of the current mirror.

Furthermore, the current supply unit 20 includes a plurality of PMOS transistors, wherein a width length ratio (W/L) of a channel of the PMOS transistor which outputs the third output current Iout3 is K times the width length ratios of other PMOS transistors, and K is more than 0.

In some embodiments of the present disclosure, the current supply unit includes PMOS transistors MP1~MP5, the sources of every PMOS transistors MP1~MP5 are electrically connected to the supply voltage VDD. The gate of the PMOS transistor MP1 is electrically connected to the drain of the PMOS transistor MP1 and the gates of every PMOS transistors MP2~MP5. The drain of the PMOS transistor MP1 is configured to be a reference current output end. A drain of the second PMOS transistor MP2 is configured as the first current output end, a drain of the third PMOS transistor MP3 is configured as the second current output end, a drain of the fourth PMOS transistor MP4 is configured as the third current output end, and a drain of the fifth PMOS transistor MP5 is configured as the fourth current output end.

The temperature compensation circuit 21 is electrically connected to the second current output end, and the temperature compensation circuit 21 includes a unidirectional conduction element and a resistor string which are in parallel, wherein the unidirectional conduction element has a first threshold voltage Vth1, which is configured to determine whether the temperature compensation circuit is conducted. Further, one end of the parallel connection between the unidirectional conduction element and the resistor string is connected to the second current output end, and the other end of the parallel connection between the unidirectional conduction element and the resistor string is a low voltage or a ground voltage GND.

In some embodiments of the present disclosure, when the temperature increases, the first threshold voltage Vth1 and the reference current Iref are decreased. Because a delay time of the oscillating signal is proportional to the first threshold voltage Vth1, and the delay time is inversely proportional to the reference current Iref, the effects of the first threshold voltage Vth1 and the reference current Iref on the delay time are counterbalanced. Therefore, the delay time of the oscillating signal is not affected by the temperature, so as to achieve the temperature compensation effect.

In some embodiments of the present disclosure, the unidirectional conduction element is an NMOS transistor NM1, and the resistor string includes a first temperature compensation resistor R1 and a second temperature compensation resistor R2. The first temperature compensation resistor R1 and the second temperature compensation resistor R2 are connected in series, one end of the first temperature compensation resistor R1 is electrically connected to the drain of the NMOS transistor NM1, and the drain of the NMOS transistor NM1 is electrically connected to the gate of the NMOS transistor NM1. The second temperature compensation resistor R2 is a variable resistor, and one end of the second temperature compensation resistor R2 is electrically connected to the low voltage or the ground voltage GND.

A bias circuit is electrically connected to a reference current output end, a first current output end and a temperature compensation circuit. The bias circuit is configured to receive a reference current, so as to generate a reference current Vref to a bias resistor R3, and output a first current to the middle node of the resistor string, so as to generate a first voltage Vr on the middle node of the resistor string. Additionally, the reference current Vref and the first voltage Vr are the same. It is noted that the first threshold voltage Vth1 is affected by the first voltage Vr because there is a voltage division relationship between the first voltage Vr and a first threshold voltage Vth1.

Furthermore, the bias circuit 22 includes two NMOS transistors, and the voltage differences between the gates and the sources of the two NMOS transistors are the same (VGS1=VGS2).

In some embodiments of the present disclosure, the bias circuit 22 includes an NMOS transistor MN2, an NMOS transistor NM3 and a bias resistor R3. The gate of the NMOS transistor MN2 is electrically connected to the drain of the NMOS transistor MN3. A first end of the bias resistor R3 is electrically connected to the source of the NMOS transistor MN2, and a second end of the bias resistor R3 is electrically connected to a low voltage or a ground voltage GND. It is noted that, even the bias circuit 22 is implemented by only one bias resistor R3 in the embodiment of FIG. 2, the present disclosure is not limited thereto.

A drive circuit 23 is electrically connected to a third current output end and a fourth current output end. The drive circuit 23 includes an output transistor NM4 and a capacitor C. Two ends of the capacitor C are respectively electrically connected to the gate and the source of the output transistor NM4, and the source of the output transistor NM4 is electrically connected to a low voltage. The output transistor NM4 includes a second threshold voltage, which is configured to determine whether output transistor NM4 turns on/off, and an oscillating signal is generated by turning on and off the output transistor NM4.

Moreover, when the second threshold voltage Vth2 is greater than or equal to the threshold voltage of the output transistor NM4 so that the output transistor NM4 turns on, an output voltage (Vout) of an output oscillating signal is pulled-down to the low voltage or the ground voltage GND.

On the contrary, when the second threshold voltage Vth2 is lower than the threshold voltage of the output transistor NM4 so that the output transistor NM4 turns off, the output voltage (Vout) of the output oscillating signal is pulled-up to the high voltage (in this circuit, Vout gets closer to VDD). In this circuit, the first threshold voltage Vth1 is equal to the second threshold voltage Vth2.

In some embodiments of the present disclosure, the output transistor NM4 in the drive circuit is an NMOS transistor.

In some embodiments of the present disclosure, the period and the frequency of the oscillating signal finally generated by the oscillating circuit is calculated by formula V and formula VI. Formula V and VI show that only the delay time td is related to temperature in the period and the frequency of the oscillating signal. As mentioned before, when temperature increases, the first threshold voltage Vth1 and the reference current Iref are decreased. Because the delay time td of the oscillating signal is proportional to the first threshold voltage Vth1, and the delay time td is inversely proportional to the reference current Iref, the effects of the first threshold voltage Vth1 and the reference current Iref on the delay time td are counterbalanced, so that the delay time td of the oscillating signal is not affected by the temperature. Thus, there are no relationships between the period/frequency of the oscillating signal and temperature. The detailed mathematical relationships are described below.

Vth1=Vth2
R1=R3=KR2, wherein K is constant.

$$Iref=[Vr+(VGS1-VGS2)]/R3 \quad \text{(formula I)}$$

When VGS1=VGS2:

$$Iref=Vr/R3 \quad \text{(formula II)}$$

The voltage Vr of the variable resistor R2 generates formula III by KCL, and formula III is brought into formula II to generate formula IV.

$$Vr=Vth1*(R1/R2) \quad \text{(formula III)}$$

$$Iref=Vr/R3=Vth1/(K*R) \quad \text{(formula IV)}$$

$$T=2((C*Vth/Iref)+td)=2(K*RC+td) \quad \text{(formula V)}$$

$$f=1/(2((K*RC)+td)) \quad \text{(formula VI)}$$

A clock buffer 24 is electrically connected to the drive circuit 23. The clock buffer 24 is configured to cache the oscillating signal, and output the buffered oscillating signal as a clock signal.

On the other hand, an electronic apparatus is further provided in the embodiments of the present disclosure, and the electronic apparatus includes the oscillator 2 and a function circuit. The function circuit is electrically connected to the oscillator 2, and the function circuit is configured to operate based on an oscillating signal outputted by the oscillator 2. Also, the function circuit is related to the type of the electronic apparatus. For example, if the electronic apparatus is a microcontroller device, the function circuit is a micro control unit. For instance, the electronic apparatus may be a memory device. The types of the electronic apparatus and the function circuit are not limited thereto.

All examples and embodiments in the present disclosure are only used to state the purpose. The modifications or changes based on the present disclosure will be suggested to those skilled in the art, and are be included in the essence, the scope, and the scope of the appended claims in the present disclosure.

What is claimed is:

1. A low power oscillator circuit, comprising:
    a current supply unit, having a reference current output end, a first current output end, a second current output end, a third current output end, and a fourth current output end, wherein a reference current is outputted via the reference current output end, a first output current is outputted via the first current output end, a second output current is outputted via the second current output end, a third output current is outputted via the third current output end, a fourth output current is outputted via the fourth current output end, the reference current is decreased as a temperature increases, wherein the first output current, the second output current, the third output current, and the fourth output current are proportional to the reference current;
    a temperature compensation circuit, electrically connected to the second current output end, and comprising a unidirectional conduction element, and a resistor string which is connected to the unidirectional conduction element in parallel, wherein the unidirectional conduction element has a first threshold voltage, and the first threshold voltage is configured to determine whether the unidirectional conduction element is conducted, one end of the unidirectional conduction element that is connected to the resistor string is connected to the second current output end, and the other end of the unidirectional conduction element that is connected to the resistor string is at a low voltage;
    a bias circuit, electrically connected to the reference current output end, the first current output end and the temperature compensation circuit, and configured to receive the reference current to generate a reference voltage and output the first output current to a middle node of the resistor string, to make a voltage of the middle node of the resistor string the same as the reference voltage, wherein the voltage of the middle node is configured to determine the first threshold voltage; and
    a drive circuit, electrically connected to the third current output end and the fourth current output end, and comprising an output transistor and a capacitor, wherein one end of the capacitor is electrically connected to a gate of the output transistor, another end of the capacitor is electrically connected to a source of the output transistor, and the source of the output transistor is electrically connected to the low voltage;
        wherein the output transistor has a second threshold voltage, the second threshold voltage is configured to determine to turn on/off the output transistor, the output transistor generates an oscillating signal via turning on/off, and the first threshold voltage is equal to the second threshold voltage.

2. The low power oscillator circuit of claim 1, wherein the current supply unit comprises a plurality of PMOS transistors, a width length ratio of a channel of one of the plurality of PMOS transistors outputting the third output current is K times a width length ratio of another of the plurality of PMOS transistors, and K is more than 0.

3. The low power oscillator circuit of claim 1, wherein the bias circuit comprises:
    two NMOS transistors, wherein each of the two NMOS transistors has a gate-to-source voltage difference, and the gate-to-source voltage differences of the two NMOS transistors are the same.

4. The low power oscillator circuit of claim 1, wherein when the temperature is increased, the first threshold voltage and the reference voltage are decreased, a delay time of the oscillating signal is proportional to the first threshold voltage, and the delay time is inversely proportional to the reference current, the effect of the first threshold voltage on the delay time counterbalances the effect of the reference current on the delay time, so that the delay time of the oscillating signal is not effected by the temperature.

5. The low power oscillator circuit of claim 1, further comprising:
a clock buffer, electrically connected to the drive circuit, and configured to buffer the oscillating signal and output the buffered oscillating signal as a clock signal.

6. The low power oscillator circuit of claim 1, wherein the current supply unit comprises a first PMOS transistor, a second PMOS transistor, a third PMOS transistor, a fourth PMOS transistor and a fifth PMOS transistor, sources of the first PMOS transistor, the second PMOS transistor, the third PMOS transistor, the fourth PMOS transistor and the fifth PMOS transistor are electrically connected to a system voltage, wherein a gate of the first PMOS transistor is electrically connected to a drain of the first PMOS transistor and gates of the second PMOS transistor, the third PMOS transistor, the fourth PMOS transistor and the fifth PMOS transistor, a drain of the first PMOS transistor is used as the reference current output end, a drain of the second PMOS transistor is used as the first current output end, a drain of the third PMOS transistor is used as the second current output end, a drain of the fourth PMOS transistor is used as the third current output end, and a drain of the fifth PMOS transistor is used as the fourth current output end.

7. The low power oscillator circuit of claim 6, wherein the unidirectional conduction element of the temperature compensation circuit is a first NMOS transistor, the resistor string comprises a first temperature compensation resistor and a second temperature compensation resistor, the first temperature compensation resistor and the second temperature compensation resistor are connected in series, one end of the first temperature compensation resistor is electrically connected to the drain of the first NMOS transistor, the drain of the first NMOS transistor is electrically connected to the gate of the NMOS transistor, and one end of the second temperature compensation resistor is electrically connected to the low voltage.

8. The low power oscillator circuit of claim 7, wherein the bias circuit comprises a second NMOS transistor, a third NMOS transistor and a bias resistor, the gate of the second NMOS transistor is electrically connected to the gate and the drain of the third NMOS transistor, a first end of the bias resistor is electrically connected to the source of the second NMOS transistor, and a second end of the bias resistor is electrically connected to the low voltage.

9. A low power oscillator circuit, comprising:
a current supply unit, configured to generate a reference current, and generate a first current, a second current, a third current and a fourth current based on the reference current, wherein the first current, the second current, the third current and the fourth current are proportional to the reference current;
a temperature compensation circuit, electrically connected to the current supply unit, configured to receive the second current, and comprising an unidirectional conduction element, and a resistor string which is connected to the unidirectional conduction element in parallel, wherein the unidirectional conduction element has a first threshold voltage, the first threshold voltage is configured to determine whether the unidirectional conduction element is conducted, one end of the unidirectional conduction element that is connected to the resistor string is configured to receive the second current, and the other end of the unidirectional conduction element that is connected to the resistor string in parallel is at a low voltage;
a bias circuit, electrically connected to the current supply unit and the temperature compensation circuit, configured to receive the reference current, generate a reference voltage and output an output current to a middle node of the resistor string, so as to generate a voltage at the middle node of the resistor string, wherein the voltage is the same as the reference voltage, and configured to determine the first threshold voltage; and
a drive circuit, electrically connected to the current supply unit, and comprising an output transistor and a capacitor, wherein one end of the capacitor is electrically connected to a gate of the output transistor, another end of the capacitor is electrically connected to a source of the output transistor, the source of the output transistor is electrically connected to the low voltage, the end of the capacitor is configured to receive the third current, a drain of the output transistor is configured to receive the fourth current, the output transistor has a second threshold voltage, the second threshold voltage is configured to determine whether the output transistor is conducted, the second threshold voltage is the same as the first threshold voltage, and the drain of the output transistor is configured to output an oscillating signal.

10. An electronic device, comprising:
a low power oscillator circuit, comprising:
a current supply unit, having a reference current output end, a first current output end, a second current output end, a third current output end, and a fourth current output end, wherein a reference current is outputted via the reference current output end, a first output current is outputted via the first current output end, a second output current is outputted via the second current output end, a third output current is outputted via the third current output end, a fourth output current is outputted via the fourth current output end, the reference current is decreased as a temperature increases, wherein the first output current, the second output current, the third output current, and the fourth output current are proportional to the reference current;
a temperature compensation circuit, electrically connected to the second current output end, and comprising a unidirectional conduction element, and a resistor string which is connected to the unidirectional conduction element in parallel, wherein the unidirectional conduction element has a first threshold voltage, and the first threshold voltage is configured to determine whether the unidirectional conduction element is conducted, one end of the unidirectional conduction element that is connected to the resistor string is connected to the second current output end, and the other end of the unidirectional conduction element that is connected to the resistor string is at a low voltage;
a bias circuit, electrically connected to the reference current output end, the first current output end and the temperature compensation circuit, and configured to receive the reference current to generate a reference voltage and output the first output current to a middle node of the resistor string, to make a voltage of the middle node of the resistor string the same as the reference voltage, wherein the voltage of the middle node is configured to determine the first threshold voltage;

a drive circuit, electrically connected to the third current output end and the fourth current output end, and comprising an output transistor and a capacitor, wherein one end of the capacitor is electrically connected to a gate of the output transistor, the other end of the capacitor is electrically connected to a source of the output transistor, and the source of the output transistor is electrically connected to the low voltage;

wherein the output transistor has a second threshold voltage, the second threshold voltage is configured to determine to turn on/off the output transistor, the output transistor generates an oscillating signal via turning on/off, and the first threshold voltage is equal to the second threshold voltage; and a function circuit, electrically connected to the low power oscillator circuit, configured to operate based on an oscillating signal.

11. The electronic device of claim 10, wherein the current supply unit comprises a plurality of PMOS transistors, a width length ratio of a channel of one of the plurality of PMOS transistors outputting the third output current is K times a width length ratio of another of the plurality of PMOS transistors, and K is more than 0.

12. The electronic device of claim 10, wherein the bias circuit comprises:

two NMOS transistors, wherein each one of the two NMOS transistors has a gate-to-source voltage difference, and the gate-to-source voltage differences of the two NMOS transistors are the same.

13. The electronic device of claim 10, wherein when the temperature is increased, the first threshold voltage and the reference voltage are decreased, a delay time of the oscillating signal is proportional to the first threshold voltage, and the delay time is inversely proportional to the reference current, the effect of the first threshold voltage on the delay time counterbalances the effect of the reference current on the delay time, so that the delay time of the oscillating signal is not effected by the temperature.

14. The electronic device of claim 10, further comprising:

a clock buffer, electrically connected to the drive circuit, and configured to buffer the oscillating signal and output the buffered oscillating signal as a clock signal.

15. The electronic device of claim 10, wherein the current supply unit comprises a first PMOS transistor, a second PMOS transistor, a third PMOS transistor, a fourth PMOS transistor and a fifth PMOS transistor, the sources of the first PMOS transistor, the second PMOS transistor, the third PMOS transistor, the fourth PMOS transistor and the fifth PMOS transistor are electrically connected to a system voltage, wherein a gate of the first PMOS transistor is electrically connected to a drain of the first PMOS transistor and gates of the second PMOS transistor, the third PMOS transistor, the fourth PMOS transistor and the fifth PMOS transistor, a drain of the first PMOS transistor is used as the reference current output end, a drain of the second PMOS transistor is used as the first current output end, a drain of the third PMOS transistor is used as the second current output end, a drain of the fourth PMOS transistor is used as the third current output end, and a drain of the fifth PMOS transistor is used as the fourth current output end.

16. The electronic device of claim 15, wherein the uni-directional conduction element of the temperature compensation circuit is a first NMOS transistor, the resistor string comprises a first temperature compensation resistor and a second temperature compensation resistor, the first temperature compensation resistor and the second temperature compensation resistor are connected in series, one end of the first temperature compensation resistor is electrically connected to the drain of the first NMOS transistor, the drain of the first NMOS transistor is electrically connected to the gate of the NMOS transistor, and one end of the second temperature compensation resistor is electrically connected to the low voltage.

17. The electronic device of claim 16, wherein the bias circuit comprises a second NMOS transistor, a third NMOS transistor and a bias resistor, the gate of the second NMOS transistor is electrically connected to the gate and the drain of the third NMOS transistor, a first end of the bias resistor is electrically connected to the source of the second NMOS transistor, and a second end of the bias resistor is electrically connected to the low voltage.

* * * * *